United States Patent
Pedersen

(10) Patent No.: US 7,441,223 B1
(45) Date of Patent: Oct. 21, 2008

(54) METHOD AND APPARATUS FOR PERFORMING SYNTHESIS TO IMPROVE DENSITY ON FIELD PROGRAMMABLE GATE ARRAYS

(75) Inventor: Bruce Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 231 days.

(21) Appl. No.: 11/031,689

(22) Filed: Jan. 7, 2005

(51) Int. Cl.
*G06F 17/50* (2006.01)
(52) U.S. Cl. .......................... 716/16; 716/12
(58) Field of Classification Search ............. 716/2, 716/16–18
See application file for complete search history.

(56) References Cited

U.S. PATENT DOCUMENTS

| | | | |
|---|---|---|---|
| 6,195,788 B1 * | 2/2001 | Leaver et al. ............ | 716/18 |
| 6,408,422 B1 * | 6/2002 | Hwang et al. ............ | 716/3 |
| 7,111,273 B1 * | 9/2006 | Ganesan et al. .......... | 716/17 |
| 7,124,392 B2 * | 10/2006 | Sharma .................... | 716/17 |
| 7,194,723 B1 * | 3/2007 | Hwang et al. ............ | 716/17 |
| 7,243,329 B2 * | 7/2007 | Chua et al. ............... | 716/16 |
| 7,249,329 B1 * | 7/2007 | Baeckler et al. .......... | 716/3 |
| 2004/0133869 A1 * | 7/2004 | Sharma .................... | 716/16 |
| 2005/0177808 A1 * | 8/2005 | Dewan .................... | 716/16 |

\* cited by examiner

*Primary Examiner*—Jack Chiang
*Assistant Examiner*—Binh C Tat
(74) *Attorney, Agent, or Firm*—L. Cho

(57) ABSTRACT

A method for designing a system on a programmable logic device (PLD) includes implementing a first network of logic elements (LEs) and a second network of LEs with a combined network of LEs that performs a same functionality but utilizes a fewer number of LEs.

22 Claims, 6 Drawing Sheets

US 7,441,223 B1

METHOD AND APPARATUS FOR PERFORMING SYNTHESIS TO IMPROVE DENSITY ON FIELD PROGRAMMABLE GATE ARRAYS

FIELD

Embodiments of the present invention relates to field programmable gate arrays (FPGAs). More specifically, embodiments of the present invention relates to a method and apparatus for performing synthesis to improve density on FPGAs.

BACKGROUND

FPGAs may be used to implement large systems that include millions of gates and megabits of embedded memory. The process flow for implementing a system onto a target FPGA device includes performing synthesis, placement, and routing. Synthesis involves generating a logic design of the system to be implemented by a target device and mapping the logic design onto resources on the FPGA that will implement the logic design. The tasks of performing synthesis, placement, and routing can be both challenging and time consuming. In order to implement a system with the limited resources on an FPGA, several iterations are often required to determine an acceptable logic design and appropriate mapping of resources on the FPGA to components in the logic design. The complexity of large systems often requires the use of EDA tools to manage and optimize their design onto physical target devices. EDA tools have been used by designers to perform the time consuming task of synthesis, placement, and routing of components onto physical devices.

Traditional EDA tools typically operate only on individual cones of logic to map a network of logic gates in the cones of logic to a network of look up tables that are programmed to perform an equivalent functionality. These EDA tools do not examine how individual cones of logic relate to other cones of logic in a logic design for optimization purposes. When a system requires the use of resources that exceed the offering of a particular FPGA platform, these EDA tools may fail to generate an acceptable mapped logic design.

Thus what is needed is an effective method and apparatus for performing synthesis to improve the density on FPGAs.

SUMMARY

An embodiment of the present invention includes a technique for performing synthesis re-examination that reduces the number of logic elements required for implementing a mapped logic design. A mapped logic design of a first network of logic elements (LEs) and a second network of LEs is converted into a combined network of LEs that performs a same functionality but that utilizes a fewer number of LEs. The programmable versatility of the look up tables (LUTs) in the LEs are utilized by translating two or more independent networks of LEs, where the LEs implement relatively non-complex functions, into a single combined network of LEs, where the LEs implement a relatively more complex function. This generates unused LEs that may be conserved for other purposes.

BRIEF DESCRIPTION OF THE DRAWINGS

The features and advantages of embodiments of the present invention are illustrated by way of example and are not intended to limit the scope of the embodiments of the present invention to the particular embodiments shown.

DETAILED DESCRIPTION

In the following description, for purposes of explanation, specific nomenclature is set forth to provide a thorough understanding of embodiments of the present invention. However, it will be apparent to one skilled in the art that specific details in the description may not be required to practice the embodiments of the present invention. In other instances, well-known components, programs, and procedures are shown in block diagram form to avoid obscuring embodiments of the present invention unnecessarily.

Figure 1:
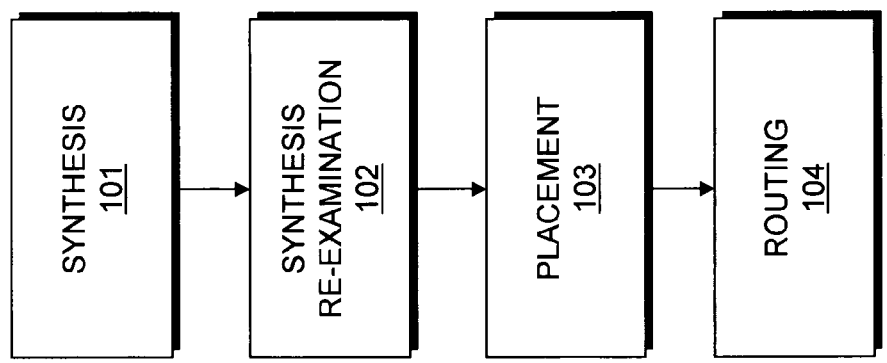
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay. Synthesis also includes mapping the optimized logic design. Mapping includes determining how to implement the logic components such as logic gates in the optimized logical representation with general resources available on the target device. According to an embodiment of the present invention, a netlist is generated from mapping. The netlist illustrates how the general resources available on the target device are utilized to implement the system. The netlist may, for example, include a representation of the resources on the target device as nodes and how the nodes are connected. The netlist may be an optimized technology-mapped netlist generated from the HDL.

Figure 2:
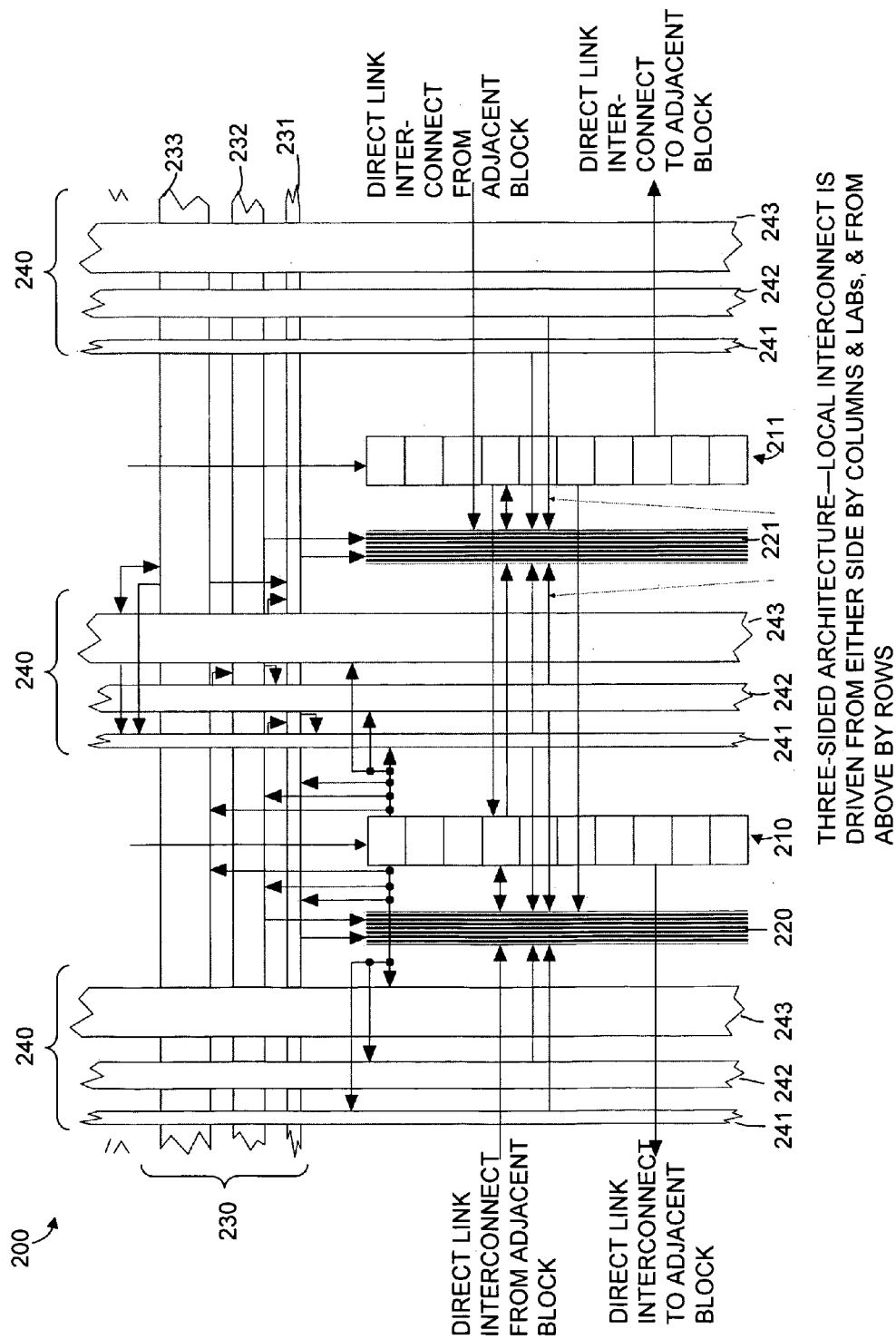
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 200, an LE may include a 4-input lookup table (LUT) with a configurable flip-flop. It should be appreciated that the LE may implement a LUT with other configurations.

The target device 200 includes a plurality of logic-array blocks (LABs). Each LAB is formed from a plurality LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220-221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220-221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include components other than those described in reference to the target device 200. Thus, while the invention described herein may be utilized on the architecture described in FIG. 2, it should be appreciated that it may also be utilized on different architectures, such as those employed by Altera® Corporation in its APEX™, Mercury™, Stratix™, and Stratix™ II family of chips and those employed by Xilinx®, Inc. in its Virtex™ and Virtex™ II line of chips.

Referring back to FIG. 1, at 102, after mapping, the system is re-examined to determine whether the mapping may be further optimized to reduce the number of LEs required to implement the system. According to an embodiment of the present invention, the system may be initially mapped using parameters that are different than those used during re-examination. For example, during an initial mapping, the logic design may be mapped to N−1 input LUTs, where during and after re-examination the logic design may be mapped to N input LUTs.

During synthesis re-examination, networks of LEs that share common input signals and complementary controlling input signals are identified. These networks are combined into a single network using fewer LEs where each of the LEs implements a relatively more complex function where complexity may be measured, for example, by the number of minterms in the sum-of-products representation of the function. After the combining of networks, remaining networks may be re-mapped onto N input LUTs. It should be appreciated that the re-examination may be performed either as a separate procedure after mapping 101, or during the mapping procedure 101.

At 103, the mapped logical system design is placed. Placement works on the optimized technology-mapped netlist to produce a placement for each of the logic components. According to an embodiment of the present invention, placement includes fitting the system on the target device by determining the specific resources on the target device to be used for implementing the general resources mapped for logic components at 101. The placement procedure may be performed by a placer in an EDA tool that utilizes placement algorithms.

At 104, routing of the system is performed. During routing, routing resources on the target device are allocated to provide interconnections between logic gates, logic elements, and other components on the target device. The routing procedure may be performed by a router in an EDA tool that utilizes routing algorithms.

Figure 3:
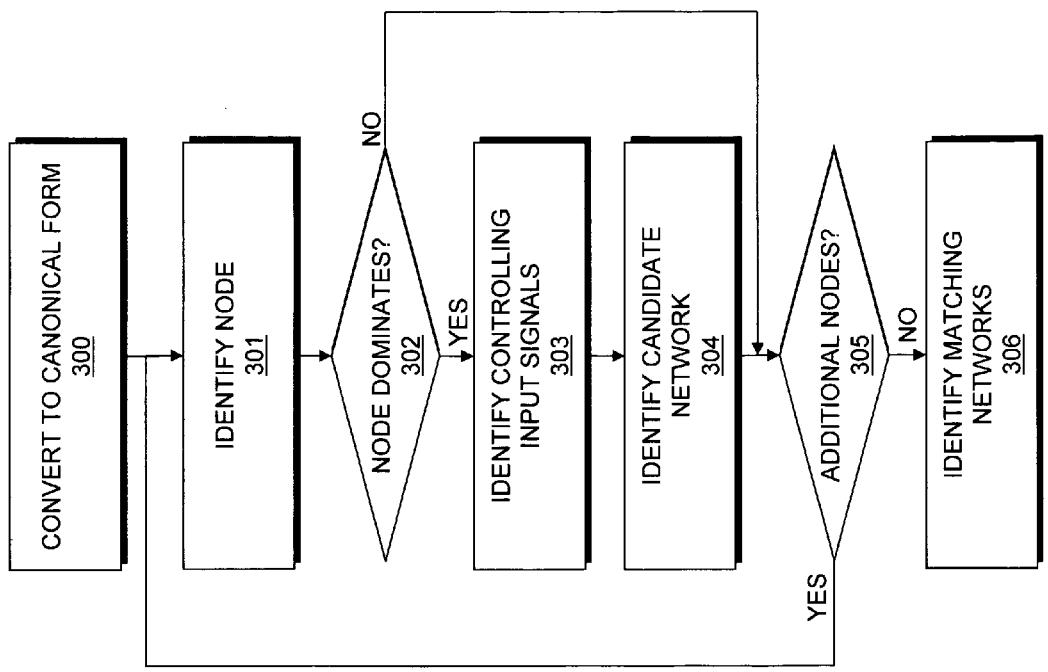
FIG. 3 is a flow chart illustrating a method for identifying candidates for combination according to an embodiment of the present invention.

FIG. 3 is a flow chart illustrating a method for identifying networks of LEs that are candidates for combination according to an embodiment of the present invention. FIG. 3 may be implemented at 102 shown in FIG. 1. At 300, a netlist is converted to a canonical form. In this embodiment, all combinational logic is expressed in terms of nodes performing an AND function, and inverters.

At 301, a mapped logical system is recursed to identify a node that is implementing an AND function.

At 302, it is determined whether the node dominates one or more other nodes. According to an embodiment of the present invention, a first node dominates a second node if every combinatorial path from the second node to any terminal node includes the first node. A node that dominates need not be directly fed by those nodes that it dominates. There are various techniques for identifying a first node that dominates a second node are described. One such technique is described in "A Fast Algorithm for Finding Dominators in a Flow Graph" by Robert E Tarjan and Thomas Lengauer, ACM Transactions on Programming Languages and Systems, Vol. 1, Issue 1, pp. 121-141 (July 1979). It should be appreciated that other techniques may also be used. If the node dominates one or more nodes, control proceeds to 303. If the node does not dominate one or more nodes, control proceeds to 305.

At 303, the other input signal(s), from non-dominated nodes and terminal nodes that directly feed a dominating node are identified as controlling inputs of all of the nodes dominated by that dominating node.

At 304, the one or more dominated nodes and their corresponding input signal(s) with the dominator node are identified as being nodes and input signals to a network that is a candidate for combination.

At 305, it is determined whether additional nodes are to be examined. If additional nodes are to be examined, control returns to 301. If additional nodes are not to be examined, control proceeds to 306.

At 306, networks having shared input signals and complementary controlling input signals are identified for combination. According to an embodiment of the present invention, information about a network's input signals and controlling signal may be listed on a hash table which is processed to identify matches.

Figure 4:
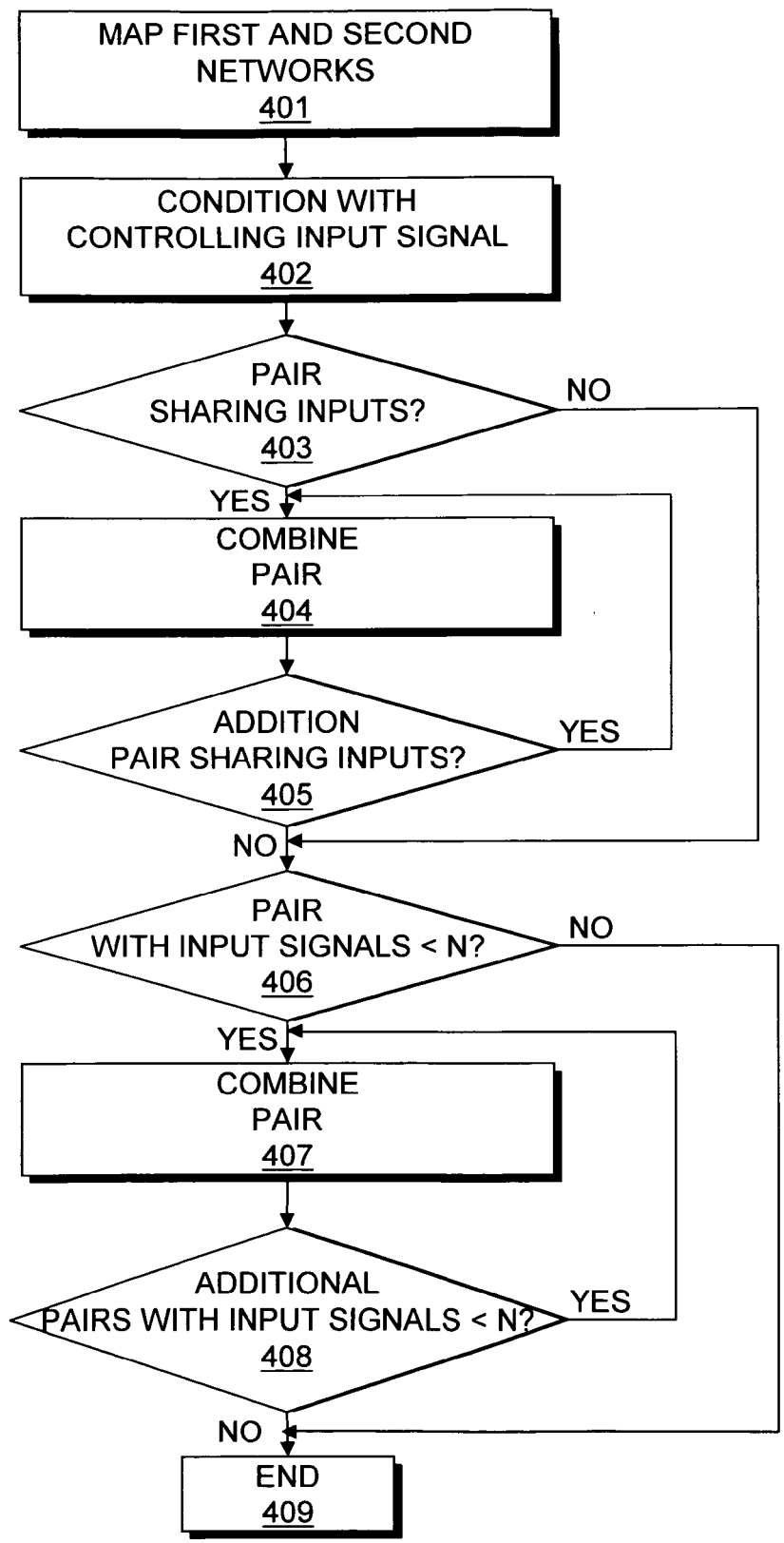
FIG. 4 is a flow chart illustrating a method for performing synthesis re-examination according to an embodiment of the present invention.

FIG. 4 is a flow chart illustrating a method for combining networks of LEs according to an embodiment of the present invention. The method shown in FIG. 4 may be implemented at 102 shown at FIG. 1. The method described combines a first network having a controlling input signal S and a second network having a complementary controlling input signal !S. At 401, each of a first and second network is independently mapped to a network of LUTs, where N−1 input signals are mapped to an N input LUT, and where the controlling input signal is excluded from the input count. According to an embodiment of the present invention, the input signals that are mapped to the LUTs of the first and second network are selected such that a LUT in the first network has a corresponding LUT in the second network with as many shared input signals as possible.

At 402, each of the LUTs is conditioned by its network's controlling input signal. LUTs that are already conditioned by their network's controlling input signal are not further conditioned.

At 403, it is determined whether a pair of LUTs in the first and second network that share the same N input signals is present. If the pair of LUTs is present, control proceeds to 404. If the pair of LUTs is not present, control proceeds to 406.

At 404, the pair of LUTs is combined into a single LUT by logically ORing the functions performed by the LUTs and replacing the destination fed by the original LUTs with the output of the new LUT.

At 405, it is determined whether an additional pair of LUTs that share the same N input signals exists. If an additional pair of LUTs exists, control returns to 404. If an additional pair of LUTs does not exist, control proceeds to 406.

At 406, it is determined whether a pair of LUTs from the first and second networks having a combined number of distinct input signals of less than N is present. If the pair of LUTs is present, control proceeds to 407. If the pair of LUTs is not present, control proceeds to 409.

At 407, the pair of LUTs is combined into a single LUT by logically ORing the functions performed by the LUTs and replacing the destination fed by the original LUTs with the output of the new LUT.

At 408, it is determined whether an additional pair of LUTs having a combined number of distinct input signals less than N exists. If an additional pair of LUTs exists, control returns to 407. If an additional pair of LUTs does not exist, control proceeds to 409 where control terminates the procedure.

FIGS. 1, 3, and 4 are flow charts illustrating methods according to exemplary embodiments of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described with respect to FIGS. 1, 3, and 4) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

Figure 5:
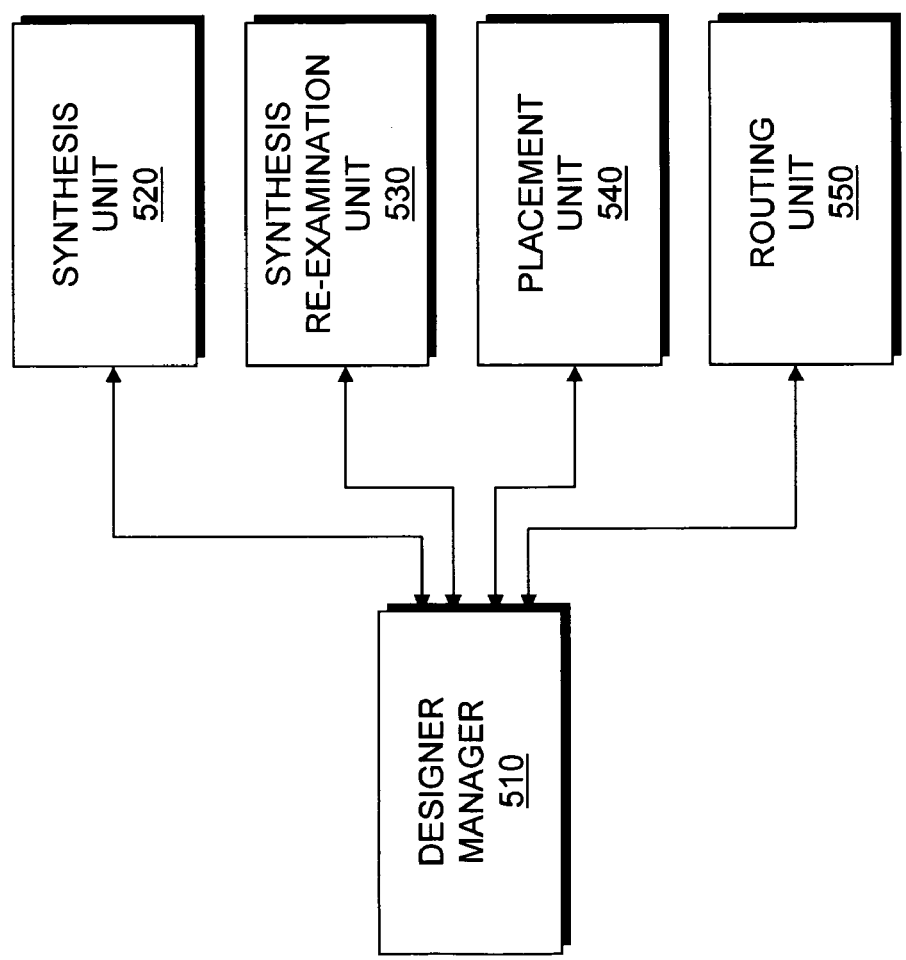
FIG. 5 is a block diagram illustrating a system designer according to an embodiment of the present invention.

FIG. 5 is a block diagram illustrating a system designer 500 according to an embodiment of the present invention. The system designer 500 may be an EDA tool. FIG. 5 illustrates software modules implementing an embodiment of the present invention. According to one embodiment, system design may be performed by a computer system (not shown) executing sequences of instructions represented by the software modules shown in FIGS. 1, 3, and 4. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 500 includes a designer manager 510. The designer manager 510 interfaces with and manages the other components in the system designer 500.

The system designer 500 includes a synthesis unit 520. The synthesis unit 520 generates a logic design of a system to be implemented by the target device such as the target device 200 shown in FIG. 2. According to an embodiment of the system designer 500, the synthesis unit 520 takes a conceptual HDL design definition and generates an optimized logical representation of the system. The optimized logical representation of the system generated by the synthesis unit 520 may include a representation that has a minimized number of components such as functional blocks and registers required for the system. Alternatively, the optimized logical representation of the system generated by the synthesis unit 520 may include a representation that has a reduced depth of logic and that generates a lower signal propagation delay. The synthesis unit 520 also determines how to implement functional blocks and registers in the optimized logic representation utilizing specific resources on the target device thus creating an optimized "technology-mapped" netlist. The technology-mapped netlist illustrates how the resources on the target device are utilized to implement the system. The technology-mapped netlist may, for example, contain components such as LEs on the target device.

The system designer 500 includes a synthesis re-examination unit 530. The synthesis re-examination unit 530 determines whether the mapped logic design may be further optimized to reduce the number of LEs required to implement the system. According to an embodiment of the present invention, the synthesis unit 520 initially maps the system using parameters that are different than those used during re-examination. For example, during an initial mapping, the logic design may be mapped to a N−1 input LUT, where during and after re-examination the logic design may be mapped to a N input LUT. The re-examination unit 530 identifies independent networks of LEs that share common input signals and complementary controlling input signals and combines these independent networks into a single network using fewer LEs. After the combination of networks, remaining networks may be re-mapped onto N input LUTs.

The system designer 500 includes a placement unit 540. The placement unit 540 fits the system on the target device by determining which resources on the target device are to be used for specific functional blocks and registers. According to an embodiment of the system designer 500, the placement unit 540 first determines how to implement portions of the optimized logic design in clusters. Clusters may represent a subset of the components on a target device such as, for example, a LAB having 10 LEs. In this embodiment, after portions of the optimized logic design are implemented in clusters, the clusters may be placed by assigning the clusters to specific LABs on the target device. Following the placement of the clusters, routing interconnections between the LEs may be performed. The placement unit 540 may utilize a cost function in order to determine a good assignment of resources on the target device.

The system designer 500 includes a routing unit 550. The routing unit 550 determines the routing resources on the target device to use to provide interconnection between the functional blocks and registers on the target device.

Figure 6:
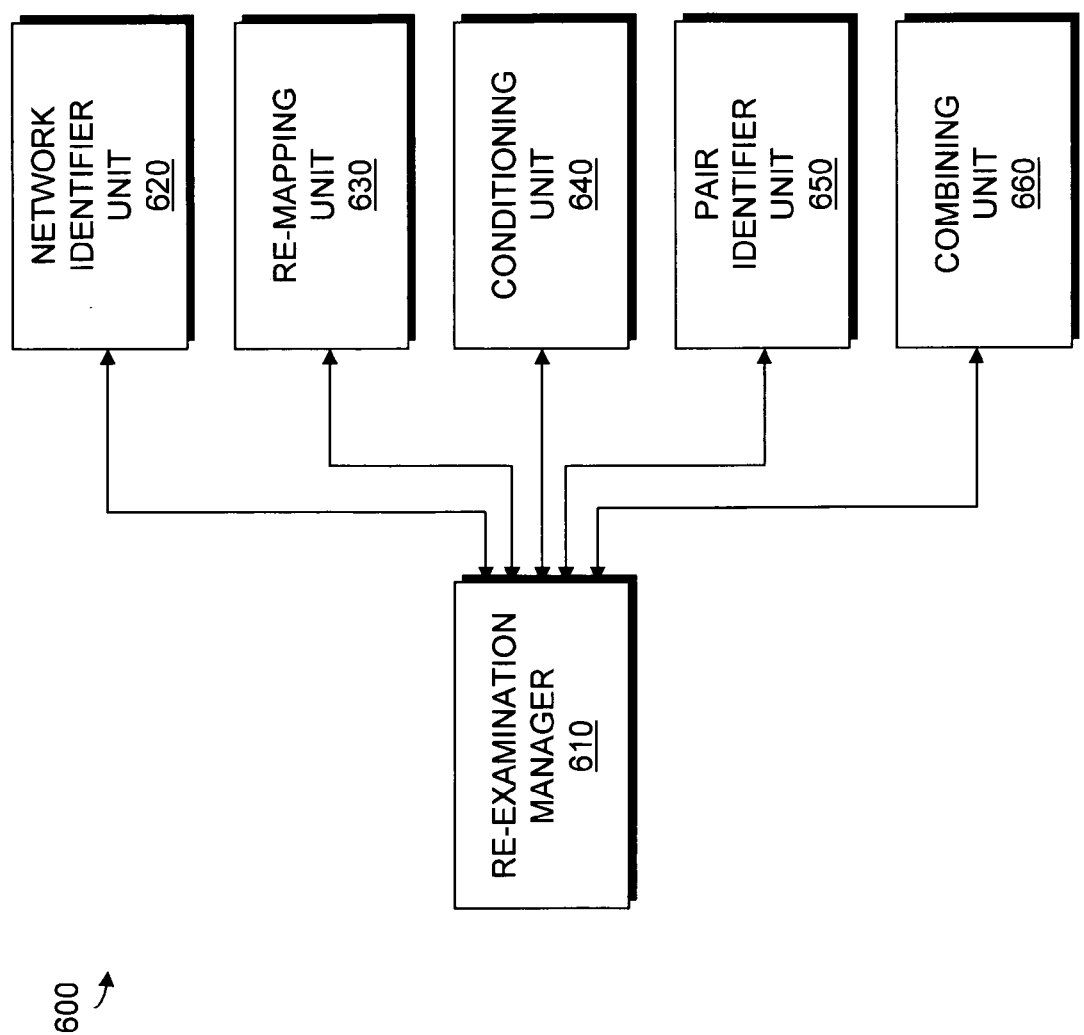
FIG. 6 is a block diagram illustrating a synthesis re-examination unit according to an embodiment of the present invention.

FIG. 6 is a block diagram illustrating a synthesis re-examination unit 600 according to an embodiment of the present invention. The synthesis re-examination unit 600 may be implemented as the synthesis re-examination unit 530 shown in FIG. 5. The synthesis re-examination unit 600 includes a re-examination manager 610. The re-examination manager 610 interfaces with and manages the other components in the synthesis re-examination unit 600.

The synthesis re-examination unit 600 includes a network identifier unit 620. The network identifier unit 620 identifies networks of LEs that share common input signals and complementary controlling input signals. According to an embodiment of the synthesis re-examination unit, the network identifier unit 620 may identify networks by recursing a mapped logic design for controlling input signals corresponding to nodes that dominate other nodes. Characteristic about the network, such as the input signals of the dominated nodes and the controlling input signal, may be compared with characteristics of other networks to find matching networks that may be combined.

The synthesis re-examination unit 600 includes a re-mapping unit 630. The re-mapping unit 630 independently maps a first and second network to a network of LUTs, where N−1 input signals are mapped to an N input LUT, and where the controlling input signal is excluded from the input count. According to an embodiment of the re-mapping unit 630, the input signals mapped to the LUTs of the first and second network are selected such that a LUT in the first network has a corresponding LUT in the second network with as many shared input signals as possible.

The synthesis re-examination unit 600 includes a conditioning unit 640. The conditioning unit 640 conditions each of the LUTs with its network's controlling input signal. LUTs that are already conditioned by their network's controlling input signal are not further conditioned.

The synthesis re-examination unit 600 includes a pair identifier unit 650. The pair identifier unit 650 identifies a pair of LUTs in the first and second network that share the same N input signals. The pair identifier unit 650 may also identifier a pair of LUTs from the first and second networks having a combined number of distinct input signals of less than N.

The synthesis re-examination unit 600 includes a combining unit 660. The combining unit 660 combines the pairs of LUTs identified by the pair identifier unit 650 into a new single LUT by logically ORing the functions performed by the LUTs and replacing the destination fed by the original LUTs with the output of the new LUT.

According to an embodiment of the synthesis re-examination unit 600, the re-examination manager 610 prompts the pair identifier unit 640 to identify LUTs that share the same N input signals for combining by the combining unit 650 before identifying LUTs from the first and second networks having a combined number of distinct input signals of less than N.

With reference to FIG. 4, an example of a method for performing synthesis re-examination is described. A first network implements the following single output function.

OUT1=!A & !B & !C & !D & !E & !F & !G & !H

A second network implements the following single output function.

OUT2=A & B & C & D & E & F & G & H

The controlling input signal for the first network is chosen to be !A and the controlling input signal for the second network is chosen to be A. It is noted that other input signals could have also been selected to be controlling input signals. The output functions can be re-expressed as shown below.

OUT1=!A & (!B & !C & !D & !E & !F & !G & !H)

OUT2=A & (B & C & D & E & F & G & H)

At 401, the first and second networks are independently mapped to a network of LUTs, where N−1 input signals are mapped to an N input LUT, and where the controlling input signal is excluded from the input count. In this example, the target system implements 4 input LUTs and the networks are mapped as shown below.

OUT1=!A & (!B & !C & T11)

T11=(!D & !E & T12)

T12=(!F & !G & !H)

OUT2=A & (B & C & T21)

T21=(D & E & T22)

T22=(F & G & H)

T11, T12, T21, and T22 are extra LUTs used to implement the decomposition.

At 402, each of the LUTs is conditioned by its network's controlling input signal. LUTs that are already conditioned by their network's controlling input signal are not further conditioned. The mapping is re-expressed as shown below.

OUT1=!A & (!B & !C & T11)

T11=!A & (!D & !E & T12)

T12=!A & (!F & !G & !H)

OUT2=A & (B & C & T21)

T21=A & (D & E & T22)

T22=A & (F & G & H)

At 403, a pair of LUTs in the first and second network that share the same N input signals, T12 and T22, is identified.

At 404, the pair of LUTs, T12 and T22, is combined into a single LUT by logically ORing the functions performed by the LUTs and replacing the destination fed by the original LUTs with the output of the new LUT. The new LUT performs the function shown below.

T3=!A & (!F & !G & !H) # A & (F & G & H)

The destinations of T11 and T21 is replaced with T3 as shown below.

OUT1=!A & (!B & !C & T11)
T11=!A & (!D & !E & T3)
OUT2=A & (B & C & T21)
T21=A & (D & E & T3)

At 405, it is determined that T11 and T21 can also be combined. Control returns to 404.

At 404, the pair of LUTs, T11 and T21, is combined into a single LUT by logically ORing the functions performed by the LUTs and replacing the destination fed by the original LUTs with the output of the new LUT. The new LUT performs the function shown below.

T4=!A & (!D & !E & T3) # A & (D & E & T3)

The destinations of T11 and T21 are replaced with T4 as shown below.

OUT1=!A & (!B & !C & T4)
OUT2=A & (B & C & T4)

At 405, control determines that all pairs of LUTs sharing the same input signals have been identified. Control proceeds to 406.

At 406, it is determined that a pair of LUTs from the first and second networks having a combined number of distinct input signals of less than N is not present. Control proceeds to 409 where the procedure is terminated.

In this example, the number of LUTs used to implement the first and second networks have been reduced from 6 LUTs to 4 LUTs.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a programmable logic device (PLD), comprising:
   generating an initial mapping of components of the system onto a first network of logic elements (LEs) and a second network of LEs from logic-array blocks (LABs);
   optimizing the initial mapping by combining the first network of LEs and the second network of LEs into a combined network of LEs that performs a same functionality but utilizes a fewer number of LEs from the LABs; and
   generating an optimized technology-mapped netlist reflecting the combined network of LEs.

2. The method of claim 1, further comprising identifying the first and second networks.

3. The method of claim 2, wherein identifying the first and second networks comprises identifying networks sharing same input signals and controlling input signals which are complements.

4. The method of claim 1, wherein combining the first network of LEs and the second network of LEs from LABs comprises:
   identifying controlling input signals, S and !S, from the first and second networks of LEs; and
   mapping input signals from the first and second networks into a first plurality of look up tables (LUTs) where N−1 input signals are assigned to each N input LUT; and
   mapping the controlling input signals with N−1 input signals into a second plurality of N input LUTs.

5. The method of claim 4, further comprising:
   conditioning each of the first plurality of LUTs for the first network with S; and
   conditioning each of the first plurality of LUTs for the second network with !S.

6. The method of claim 5, further comprising:
   identifying up to N−1 inputs to a LUT from the first network that are common with N−1 inputs to a LUT from the second network; and
   combining the N−1 inputs into a single LUT by logically ORing the two functions.

7. The method of claim 6, further comprising:
   identifying up to N−1 inputs to LUTs from the first and second networks; and
   combining the N−1 inputs into a single LUT by logically ORing the two functions.

8. The method of claim 1, further comprising:
   placing the combined network on the PLD; and
   connecting the combined network to the PLD with routine resources.

9. A machine-readable medium having stored thereon sequences of instructions, the sequences of instructions including instructions which, when executed by a processor, causes the processor to perform:
   generating an initial mapping of components of a system onto a first network of logic elements (LEs) and a second network of LEs from logic-array blocks (LABs);
   optimizing the initial mapping by combining the first network of LEs and the second network of LEs into a combined network of LEs that performs a same functionality but utilizes a fewer number of LEs from the LABs; and
   generating an optimized technology-mapped netlist reflecting the combined network of LEs.

10. The machine-readable medium of claim 9, further including sequences of instructions that when executed by the processor causes to processor to perform identifying the first and second networks.

11. The machine-readable medium of claim 10, wherein identifying the first and second networks comprises identifying networks sharing same input signals and controlling input signals which are complements.

12. The machine-readable medium of claim 9, wherein combining the first and second networks of LEs comprises:
   identifying controlling input signals, S and !S, from the first and second networks of LEs from LABs; and
   mapping input signals from the first and second network into a first plurality of look up tables (LUTs) where N−1 input signals are assigned to each N input LUT; and
   mapping the controlling input signals with N−1 input signals into a second plurality of N input LUTs.

13. The machine-readable medium of claim 12, further including sequences of instructions that when executed by the processor causes to processor to perform method of:
   conditioning each of the first plurality of LUTs for the first network with S; and
   conditioning each of the first plurality of LUTs for the second network with !S.

14. The machine-readable medium of claim 13, further including sequences of instructions that when executed by the processor causes to processor to perform:
   identifying up to N−1 inputs to a LUT from the first network that are common with N−1 inputs to a LUT from the second network; and
   combining the N−1 inputs into a single LUT by logically ORing the two functions.

15. The machine-readable medium of claim 14, further including sequences of instructions that when executed by the processor causes to processor to perform:

identifying up to N−1 inputs to LUTs from the first and second networks; and combining the N−1 inputs into a single LUT by logically ORing the two functions.

16. A system designer, comprising:

a synthesis re-examination unit that optimizes an initial mapping of a system by combining a first network of logic elements (LEs) and a second network of LEs from logic-array blocks (LABs) into a combined network of LEs that performs a same functionality but utilizes a fewer number of LEs from the LABs, and that generates an optimized technology-mapped netlist reflecting the combined network of LEs.

17. The system designer of claim 16, wherein the synthesis re-examination unit comprises a network identifier unit that identifies the first and second networks by identifying networks sharing same input signals and controlling input signals that are complements.

18. The system designer of claim 16, wherein the synthesis re-examination unit comprises a re-mapping unit that maps input signals from the first and second network into a first plurality of look up tables (LUTs) where N−1 input signals are assigned to each N input LUT, and that maps controlling input signals with N−1 input signals into a second plurality of N input LUTs.

19. The system designer of claim 18, further comprising a conditioning unit that conditions each of the first plurality of LUTs for the first network with a controlling input signal S, and that conditions each of the first plurality of LUTs for the second network with a controlling input signal !S.

20. The system designer of claim 19, further comprising a combiner unit that identifies up to N−1 inputs to a LUT from the first network that are common with N−1 inputs to a LUT from the second network, and that combines the N−1 inputs into a single LUT by logically ORing the two functions.

21. The system designer of claim 19, further comprising a combiner unit that combines up to N−1 inputs to LUTs from the first and second networks, and that combines the N−1 inputs into a single LUT by logically ORing the two functions.

22. The method of claim 1, wherein optimizing the initial mapping involves combining only networks of LEs from LABs.

* * * * *